United States Patent [19]

Shibuya

[11] 4,095,191

[45] June 13, 1978

[54] PHASE LOCKED LOOP CIRCUIT

[75] Inventor: Michio Shibuya, Yokohama, Japan

[73] Assignee: Sony Corporation, Tokyo, Japan

[21] Appl. No.: 767,024

[22] Filed: Feb. 9, 1977

[30] Foreign Application Priority Data

Feb. 16, 1976 Japan .................. 51-15702

[51] Int. Cl.² .............................................. H03B 3/04
[52] U.S. Cl. ......................................... 331/4; 331/16;
331/17; 325/403; 325/456; 325/478
[58] Field of Search ............... 331/4, 16, 17; 325/419,
325/420, 403, 456, 478

[56] References Cited

U.S. PATENT DOCUMENTS 3,487,311  12/1969  Luhowy ................................... 331/4
3,775,695  11/1973  Hill ......................................... 331/4

Primary Examiner—John Kominski
Attorney, Agent, or Firm—Lewis H. Eslinger; Alvin Sinderbrand

[57] ABSTRACT

In a phase locked loop circuit which includes a variable frequency oscillator, a reference signal oscillator, a phase comparator for detecting the phase difference between the output signals of the reference signal oscillator and the variable frequency oscillator, respectively, and a low pass filter supplied with the output of the comparator so as to provide a corresponding DC voltage for controlling the variable frequency oscillator, and in which the variable frequency oscillator is manually changed, as by a variable capacitor, so that the frequency thereof is an integral multiple of the frequency of the reference signal oscillator; a control signal generating circuit is provided to detect the DC voltage from the low pass filter and to produce a control signal when the DC voltage is outside a predetermined voltage range, with the control signal being applied to the variable frequency oscillator so as to vary the frequency thereof outside of the lock range of the phase locked loop toward the capture range thereof until the next succeeding phase locking state is obtained. In one embodiment of the invention, the control signal is used also to control an audio muting circuit, for example, in the transmitting path of a radio receiver in which the phase locked loop circuit is used as a local oscillator.

7 Claims, 37 Drawing Figures

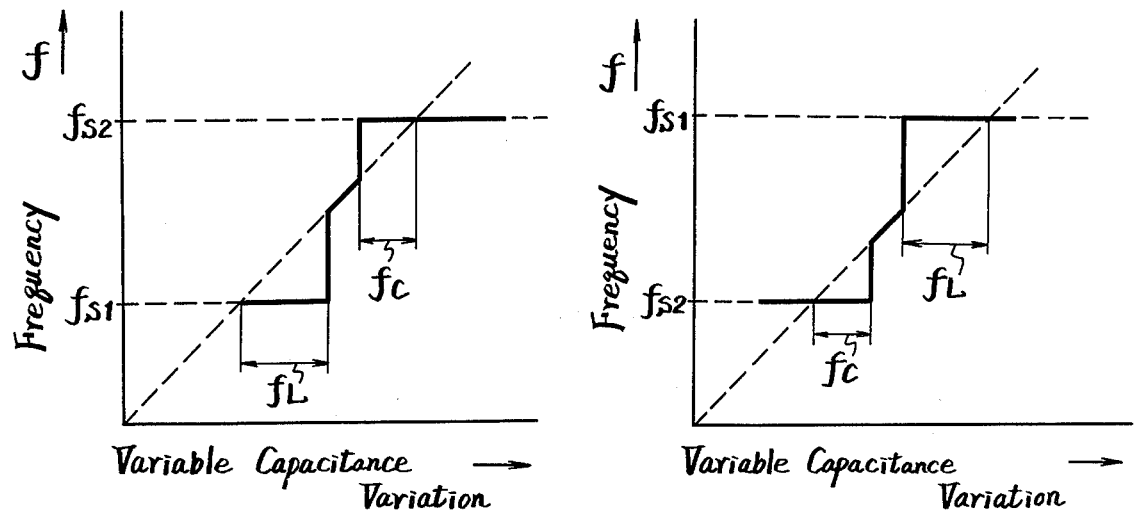
Fig. 2
Fig. 3
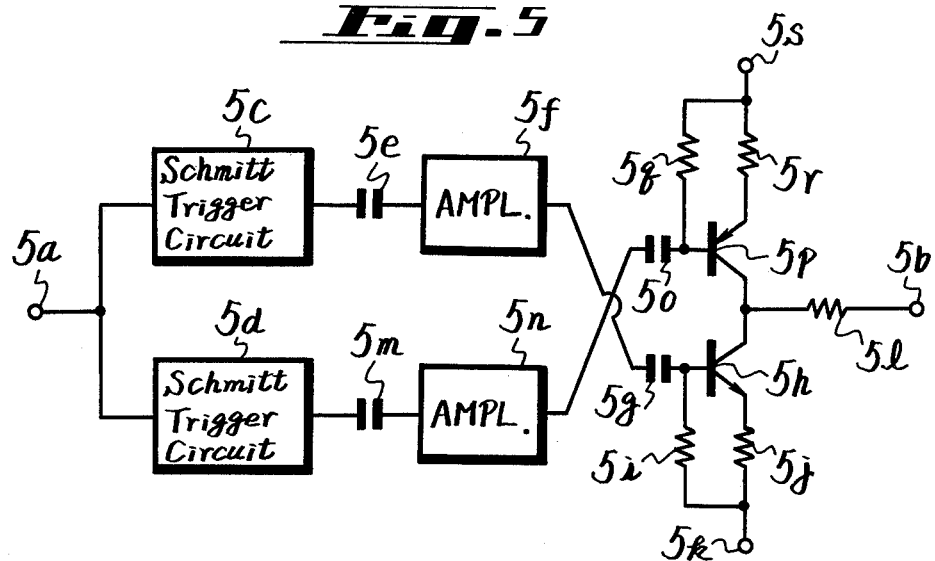
Fig. 5

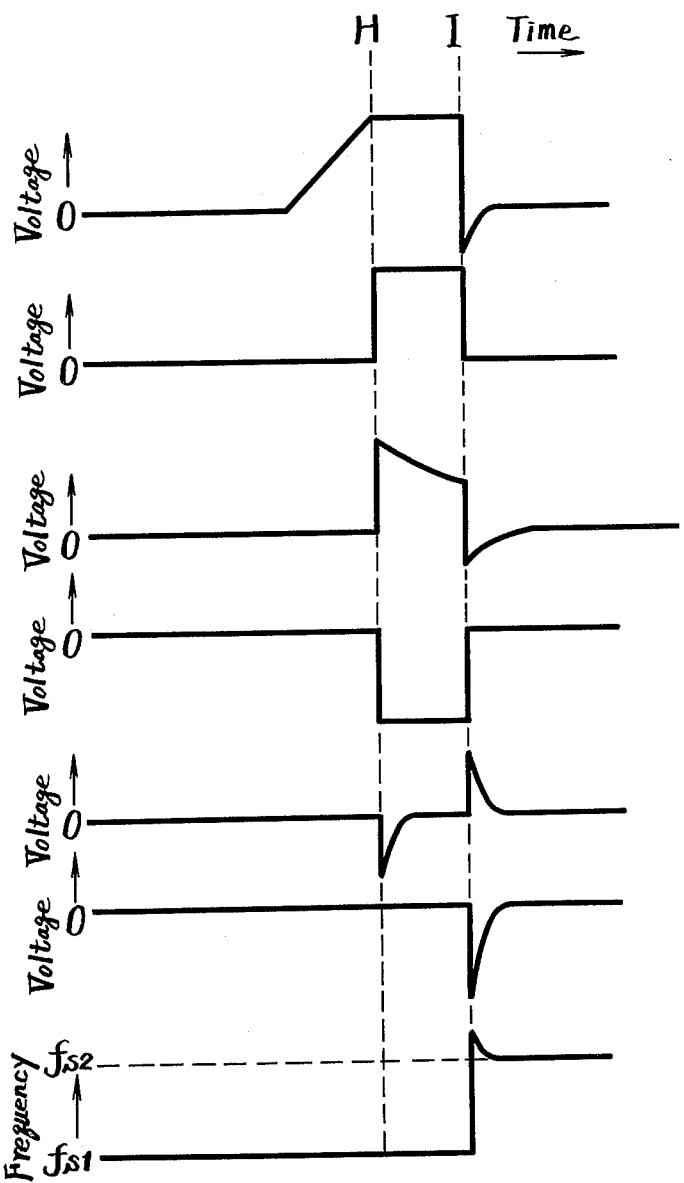

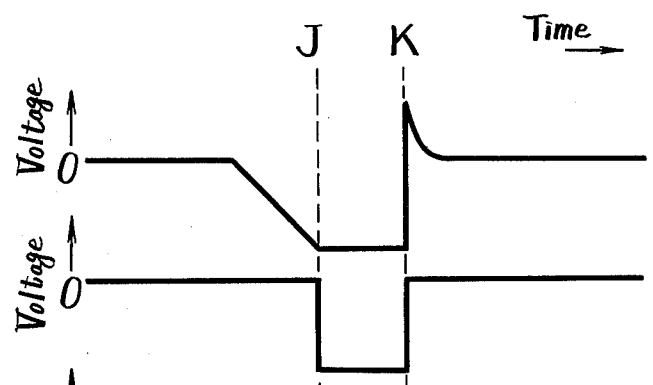
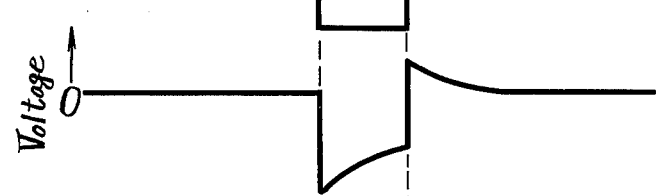
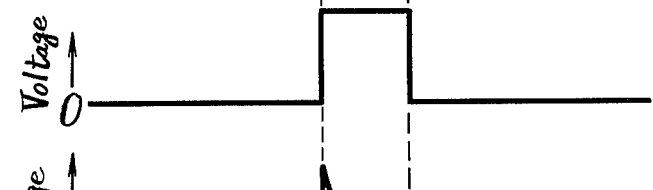
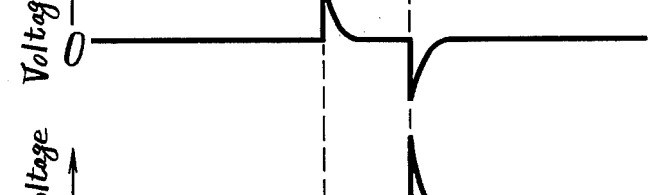
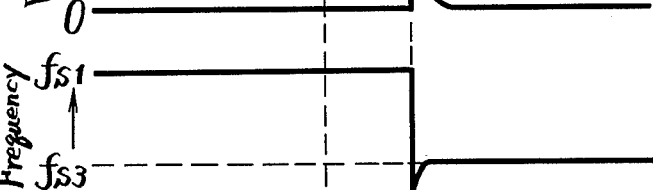
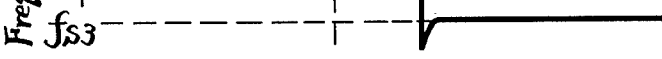

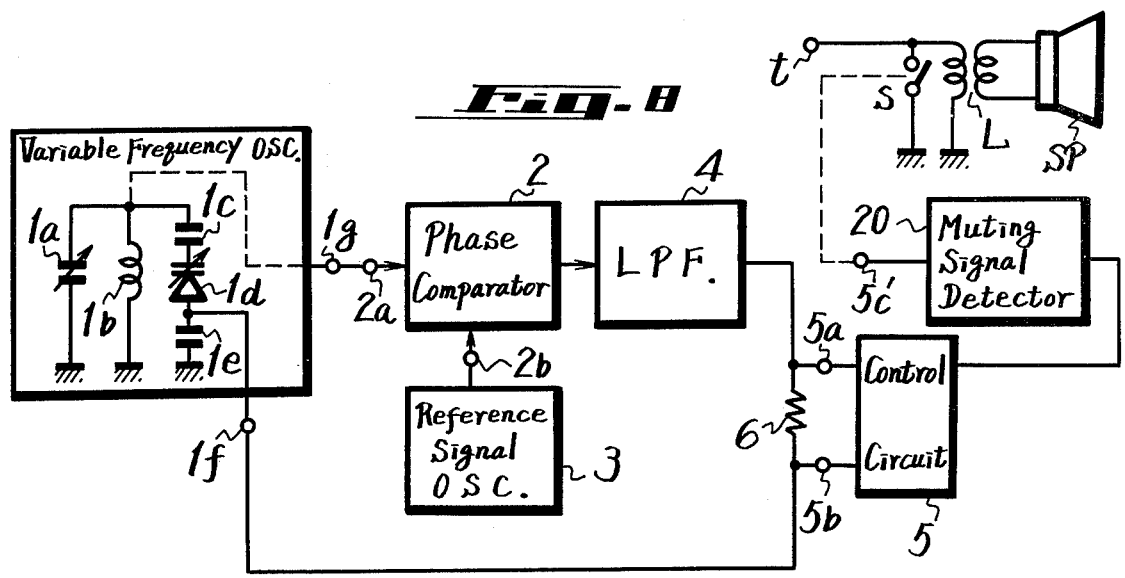
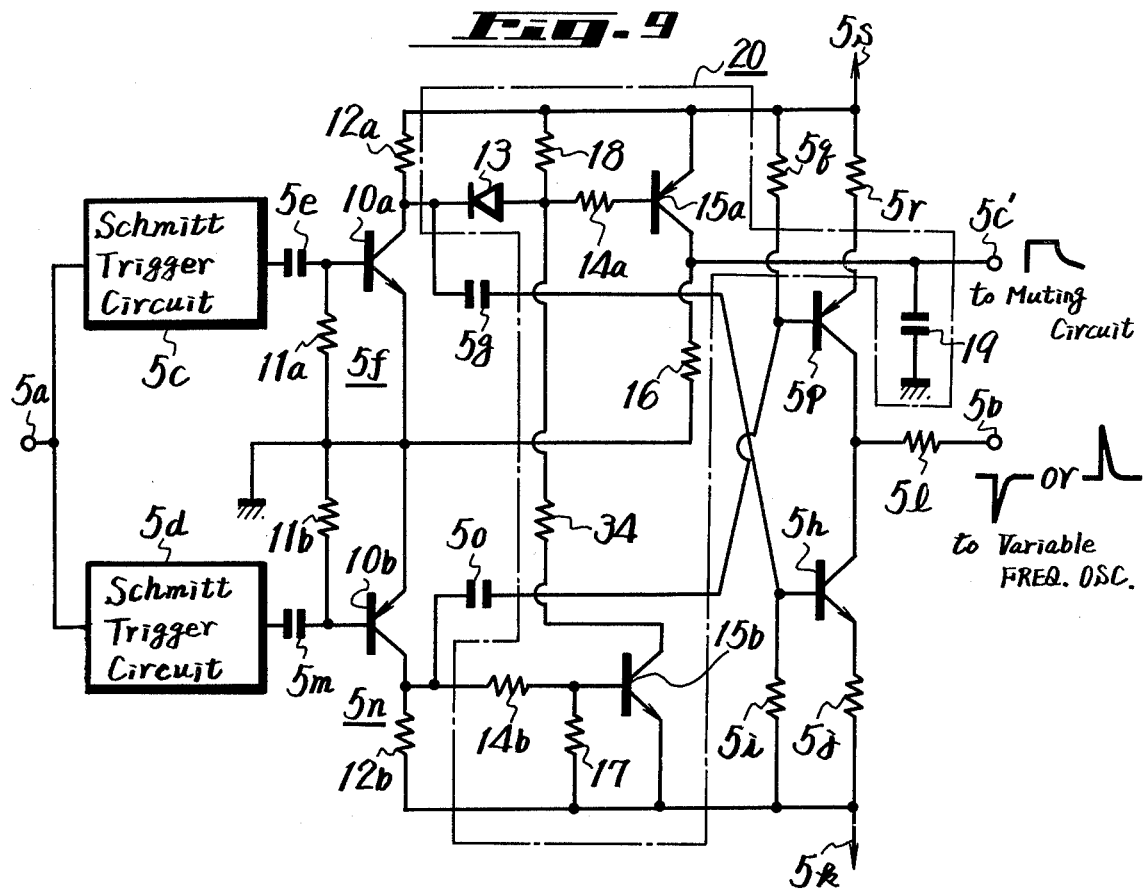

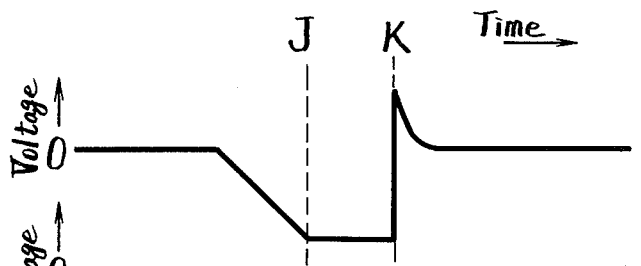
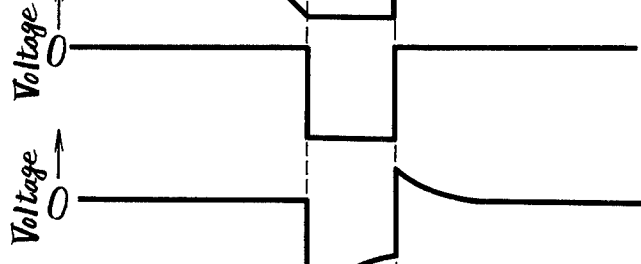
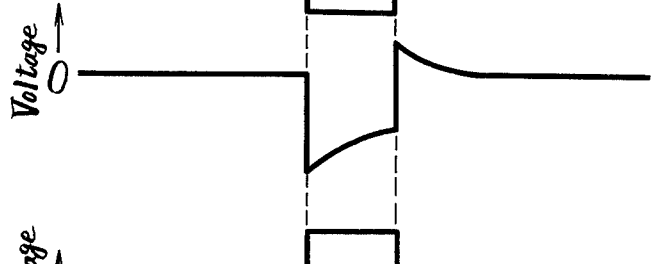
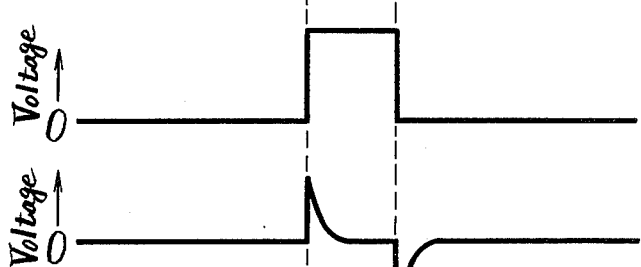
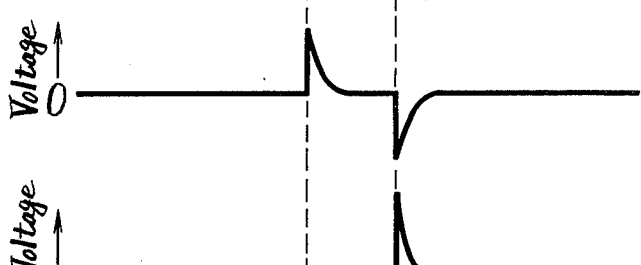
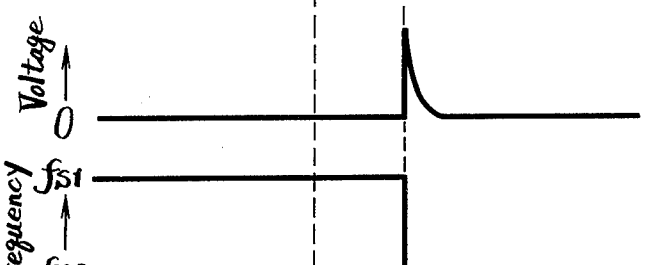
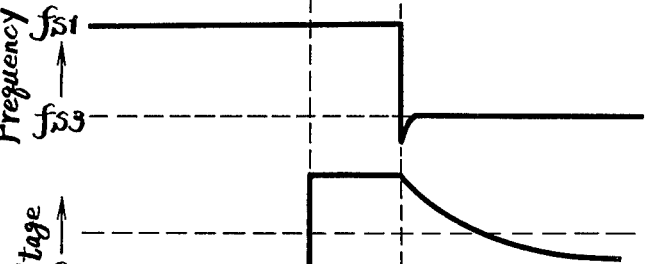
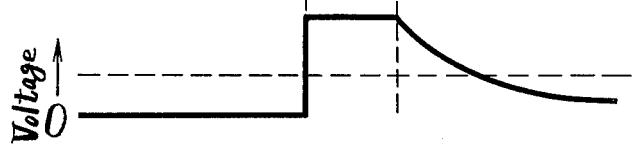

PHASE LOCKED LOOP CIRCUIT

BACKGROUND OF THE INVENTION

1. Field of the Invention

This invention relates generally to a phase locked loop circuit, and more particularly is directed to a phase locked loop circuit which has no unlocking state.

2. Description of the Prior Art

In the prior art, phase locked loop circuits have been provided which comprise a variable frequency oscillator, a reference signal oscillator, a phase comparator and a low pass filter. If such a phase locked loop circuit is employed in a local oscillation circuit of an FM radio receiver, the receiver's receiving property or the stability thereof is improved with less frequency drift due to temperature variation or time lapse.

Such phase locked loop circuits are of two types, in one of which a 1/N frequency divider is employed for varying the frequency of the variable frequency oscillator, and in the other of which a manually variable capacitor is used for the same object. Recently, since the phase locked loop circuits using a 1/N frequency divider are complicated in circuit construction and, hence, relatively costly, the phase locked loop circuits using a manually variable capacitor are becoming increasingly popular.

In phase locked loop circuits of the type in which the frequency $f_S$ of the variable frequency oscillator is varied by a variable capacitor, if the frequency of the reference signal oscillator is $f_R$ and the order of high harmonics is N, the frequency $f_S$ is expressed as $f_S = N \cdot f_R$. Thus, a desired frequency for local oscillation is obtained by selecting the order N by means of the variable capacitor.

With the above described prior art phase locked loop circuit, when the relation $(f_C + f_L) < f_R$ is established between the lock range $f_L$ of the phase locked loop, its capture range $f_C$ and the frequency $f_R$ of the reference signal oscillator, an unlocking state may be encountered at a predetermined position of the variable capacitor. When such an unlocking state occurs, an unnecessary and undesirable noise is produced in the output of the receiver.

Although a receiver which employs the prior art phase locked loop circuit in its local oscillation circuit has been provided with a muting circuit for eliminating a noise between broadcasting stations, such existing receiver does not provide a circuit for positively detecting a muting control signal for the muting circuit.

OBJECTS AND SUMMARY OF THE INVENTION

Accordingly, an object of the present invention is to provide an improved phase locked loop circuit which is free of the above problems encountered in the prior art.

Another object of the invention is to provide a phase locked loop circuit which avoids the occurrence of the unlocking state.

A further object is to provide a phase locked loop circuit, as aforesaid, in which from the DC voltage of a low pass filter used in the phase locked loop there is obtained a control signal for eliminating the unlocking state and also for controlling a variable frequency oscillator.

A still further object is to provide a phase locked loop circuit, as aforesaid, in which a control signal for eliminating the unlocking state of the phase locked loop is produced from the DC voltage of a low pass filter, and in which such control signal is used to control a variable frequency oscillator and a muting control signal is produced from the control signal.

In accordance with an aspect of this invention, in a phase locked loop circuit which includes a variable frequency oscillator, a reference signal oscillator, a phase comparator supplied with the output signals of the variable frequency oscillator and the reference signal oscillator, respectively, and detecting a phase difference therebetween, and a low pass filter supplied with the output of said phase comparator to provide a corresponding DC voltage for controlling the variable frequency oscillator so as to phase-lock the phase thereof into the phase of said reference signal oscillator, and in which the frequency of the variable frequency oscillator is varied manually in such a way that the frequency thereof is equal to an integral multiple of the frequency of the reference signal oscillator; said phase locked loop circuit is further provided with a circuit for detecting the DC voltage from the low pass filter, a circuit for generating a control signal when the DC voltage exceeds a predetermined value for example, is outside a predetermined voltage range, a circuit for combining the DC voltage and the control signal, and a circuit for controlling the frequency and phase of the variable frequency oscillator in response to the output signal of the combining circuit in such a way that the frequency of the variable frequency oscillator is varied outside of the lock range of the phase locked loop and toward the capture range of the phase locked loop until the next succeeding phase locking state is obtained.

In accordance with a feature of the present invention, the phase locked loop circuit, as previously characterized, is associated with a signal transmitting path, a muting circuit is provided in said signal transmitting path for interrupting the signal transmission therein, and a muting control signal detecting circuit adapted to control the muting circuit and being connected to the control signal generating circuit; and the control signal generating circuit comprises a pair of Schmitt trigger circuits connected to the low pass filter and producing a control pulse signal when the DC voltage from the low pass filter is outside the predetermined voltage range, with the muting control signal detecting circuit being connected to output terminals of the Schmitt trigger circuits.

The above, and other objects, features and advantages of the present invention, will become apparent from the following description which is to be read in conjunction with the accompanying drawings.

BRIEF DESCRIPTION OF THE DRAWINGS

FIGS. 2 and 3 are graphs to which reference will be made in explaining the operation of the circuit shown on FIG. 1;

FIG. 5 is a circuit diagram showing a control circuit included in the phase locked loop circuit of FIG. 4;

FIGS. 6A to 6G and FIGS. 7A to 7G are waveform diagrams to which reference will be made in explaining the operation of the embodiment of the invention shown on FIGS. 4 and 5;

FIGS. 8 and 9 are circuit diagrams showing another embodiment of the invention; and FIGS. 10A to 10H and FIGS. 11A to 11H are waveform diagrams to which reference will be made in explaining the operation of the embodiment shown on FIGS. 8 and 9.

DESCRIPTION OF THE PREFERRED EMBODIMENTS

Before describing the present invention, an example of a prior art phase locked loop circuit will first be described with reference to FIGS. 1 to 3.

Figure 1:
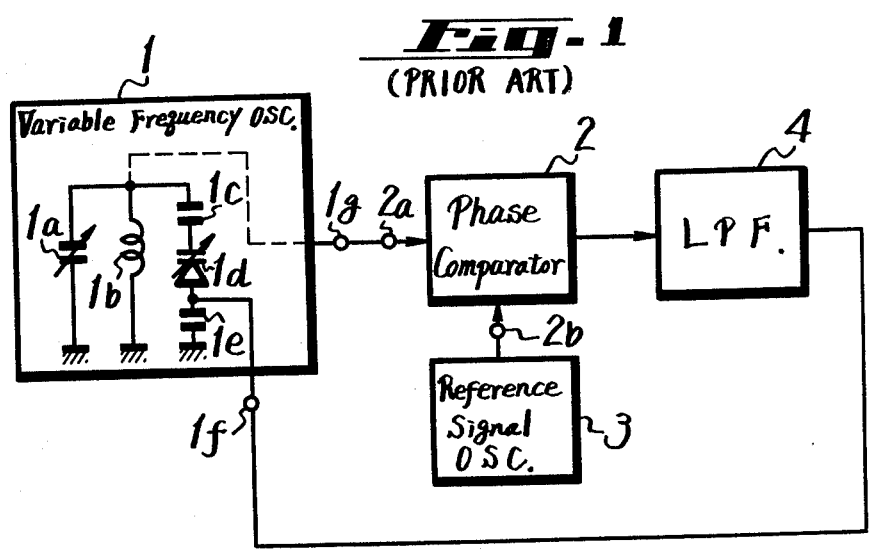
FIG. 1 is a block circuit diagram showing a prior art phase locked loop circuit.

In the phase locked loop circuit shown on FIG. 1, a variable frequency oscillator 1 of the voltage controlled type is shown as a resonance circuit of a Colpitts type transistor oscillator (not shown) and which includes a parallel circuit of a variable capacitor 1a, a coil 1b and a series circuit of a capacitor 1c, a variable capacitance or capacity diode 1d and a capacitor 1e. The anode of the variable capacity diode 1d is connected to a control signal input terminal 1f.

If it is assumed that the capacitance or capacity of the variable capacitor 1a is $C_1$, that the inductance of the coil 1b is L, and that the composite capacity or capacitance of the series circuit of the capacitor 1c, variable capacity diode 1d and capacitor 1e is $C_2$, the oscillation frequency $f_S$ of the variable frequency oscillator 1 can be expressed by the following equation (1):

$$f_S = \frac{1}{2\pi \sqrt{L(C_1 + C_2)}} \qquad (1)$$

The oscillation frequency signal from the variable frequency oscillator 1 is supplied through its output terminal 1g to one input terminal 2a of a phase comparator 2 of the phase locked loop, while another input terminal 2b of comparator 2 is supplied with a reference signal from a reference signal oscillator 3, for example, constituted by a quartz oscillator or the like. The output signal from the phase comparator 2 is fed through a low pass filter 4 to the control signal input terminal 1f of the variable frequency oscillator 1.

In the above phase locked loop circuit, if it is assumed that the oscillation frequency of the reference signal oscillator 3 is $f_R$, the following general relation is established between the oscillation frequency $f_S$ of variable frequency oscillator 1 and the oscillation frequency $f_R$ for a locking state:

$$f_S = N \cdot f_R (N = 1,2,3, \ldots)$$

This locking state will be explained with reference to the graphs of FIGS. 2 and 3, in which the ordinates represent an oscillation frequency $f$ of the variable frequency oscillator 1 when no control signal is fed to its control signal input terminal 1f and the abscissas represent the capacitance or capacity variation of the variable capacitor 1a, with $\pm f_L$ being the lock range and $\pm f_C$ being the capture range.

In the locking state, when the oscillation frequency $f$ of the variable frequency oscillator 1 perfectly coincides with a frequency $f_{S1}$, the output voltage of phase comparator 2 is zero. If the variable capacitor 1a is varied, for example, manually, so as to decrease the capacity thereof, and hence the oscillation frequency $f$ of the variable frequency oscillator 1 is increased from $f_{S1}$, the output voltage of the phase comparator 2 becomes a positive voltage in response to the difference between $f_{SL}$ and $f$ so long as the latter is in the range of $f < f_{SL} + f_L$. This output voltage is supplied through low pass filter 4 and control signal input terminal 1f to variable capacity diode 1d to decrease its backward bias. As a result, the composite capacity $C_2$ including the variable capacitance diode 1d increases to keep the capacity $(C_1+C_2)$ constant, and hence the oscillation frequency of the variable frequency oscillator 1 is kept constant at $f_{S1}$, as shown on FIG. 2.

On the contrary, if the capacity of variable capacitor 1a is increased so as to decrease the oscillation frequency $f$ of the variable frequency oscillator 1 from $f_{S1}$, the output voltage of phase comparator 2 becomes a negative voltage in response to the difference between $f$ and $f_{SL}$ so long as the oscillation frequency $f$ is in the range of $f > f_{S1} - f_L$. The output voltage of comparator 2 is again fed through low pass filter 4 and control signal input terminal 1f to variable capacitance diode 1d to increase its backward bias. As a result, the composite capacity $C_2$ including the variable capacitance diode 1d is decreased to make the capacity $(C_1+C_2)$ constant and to keep the oscillation frequency of the variable frequency oscillator 1 constant at $f_{S1}$, as shown on FIG. 3.

In the event that the locking state is changed from $f_{S1} = N_1 \cdot f_R (N_1 = 1,2,3, \ldots)$ to $f_{S2} = (N_1+1)f_R$ or to $f_{S3} = (N_1-1)f_R$, with the condition $f_L + f_C < f_R$ being maintained in the phase locked loop circuit, unlocking states occur between the respective locking states as shown on FIGS. 2 and 3. In the unlocking state, the oscillation frequency of the phase locked loop circuit becomes the free running frequency of the variable frequency oscillator 1. If the local oscillation frequency signal of the tuner in an FM radio receiver is provided by the phase locked loop circuit, an unnecessary noise may be produced in the unlocking state.

If the total gain of the phase locked loop circuit is G, $f_L = G$ is established. Thus, by changing the total gain G, the lock range is changed to eliminate the unlocking state. However, if the total gain G is changed, all the other constants, such as, the capture range, noise characterizing and so on, of the phase locked loop circuit are also changed and such is not desirable.

An embodiment of a phase locked loop circuit according to the present invention, and which is free of the defects of the prior art described above, will now be described with reference to FIGS. 4 and 5, in which the circuit elements corresponding to those described with reference to FIG. 1 are identified by the same reference numerals and a detailed description thereof will be omitted for the sake of brevity.

Figure 4:
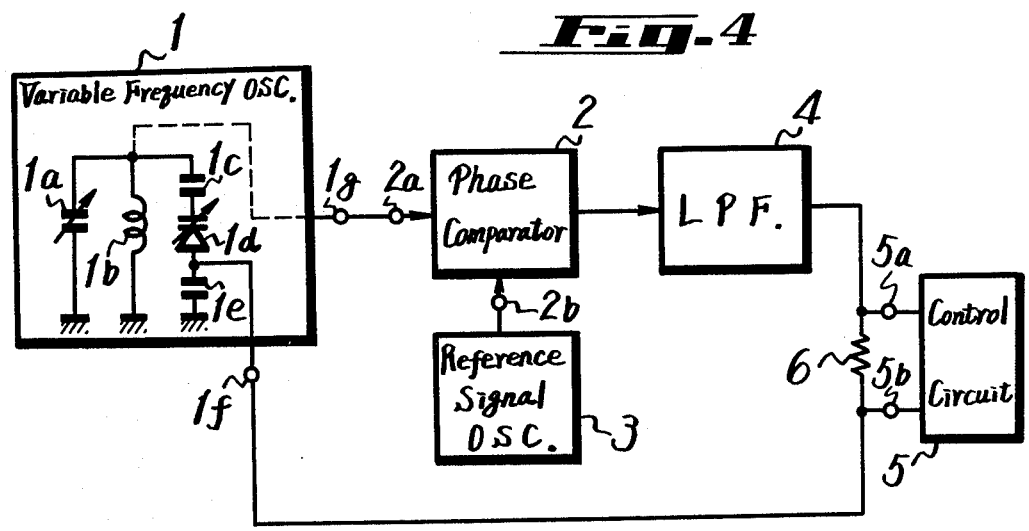
FIG. 4 is a block circuit diagram showing a phase locked loop circuit according to an embodiment of the present invention.

In the embodiment of the invention shown generally on FIG. 4, the output voltage signal from the low pass filter 4 is fed to an input terminal 5a of a control circuit 5 providing an output voltage signal at an output terminal 5b which is applied to the control signal input terminal 1f of the variable frequency oscillator 1. The input and output terminals 5a and 5b of control circuit 5 are further shown to be connected through a resistor 6.

In the control circuit 5, as shown particularly on FIG. 5, the output voltage from low pass filter 4 is supplied from input terminal 5a to Schmitt trigger circuits 5c and 5d, respectively. In this embodiment, the output voltage from Schmitt trigger circuit 5c is normally the ground potential, but becomes a predetermined positive potential when its input voltage exceeds a predetermined threshold voltage thereof, while the output voltage of the other Schmitt trigger circuit 5d is normally the ground potential but becomes a predetermined threshold voltage thereof, as will be described below.

When the input voltage to control circuit 5, that is, to Schmitt trigger circuits 5c and 5d, is within a predetermined voltage range, these circuits 5c and 5d are inoperative, and hence control circuit 5 is also inoperative. Thus, the output voltage from low pass filter 4 is fed through the resistor 6 to control signal input terminal 1f of the variable frequency oscillator 1.

The output voltage of Schmitt trigger circuit 5c is supplied through a capacitor 5e, which forms a differentiation circuit, to an inverse amplifier 5f whose output voltage is supplied through a capacitor 5g, which also forms a differentiation circuit, to the base of an NPN-type transistor 5h. The base and emitter of transistor 5h are respectively connected through a resistor 5i and a resistor 5j to a negative power supply terminal 5k which is supplied with a negative DC voltage of, for example, −15V. The collector of transistor 5h is connected through a resistor 5l to output terminal 5b. Similarly, the output voltage of the other Schmitt trigger circuit 5d is fed through a capacitor 5m, which forms a differentiation circuit, to an inverse amplifier 5n whose output is connected through a capacitor 5o, which also forms a differentiation circuit, to the base of a PNP-type transistor 5p. The base and emitter of transistor 5p are respectively connected through a resistor 5q and a resistor 5r to a positive power supply terminal 5s which is supplied with a positive DC voltage of, for example, +15V. Finally, the collector of transistor 5p is shown to be connected to the collector of transistor 5h.

The above described control circuit 5 operates as follows:

If the variable capacitor 1a of the variable frequency oscillator 1 is varied to decrease its capacity and thereby change the locking state from the frequency $f_{S1}$ to the frequency $f_{S2}$, the output voltage from low pass filter 4 increases. When this increased output voltage exceeds the threshold value of the Schmitt trigger circuit 5c at the time H on FIG. 6A, the output voltage of Schmitt trigger circuit 5c is changed to a predetermined positive potential from the ground potential, as shown in FIG. 6B. This output voltage of Schmitt trigger circuit 5c is differentiated by capacitor 5e and the resulting differentiated voltage (FIG. 6C) is fed to the input terminal of inverse amplifier 5f. Then, inverse amplifier 5f produces an output voltage (FIG. 6D) which is differentiated by the differentiation circuit formed of capacitor 5g and the resistor 5i, and the resulting voltage (FIG. 6E) applied to the base of transistor 5h. The transistor 5h is turned ON during the time interval in which its base potential is positive. Thus, as shown in FIG. 6F, the potential at the output terminal 5b falls approximately to the negative voltage which is supplied to the negative power supply terminal 5k at the time I when transistor 5h is turned ON, and thereafter returns to the original value.

As described above, the output voltage (FIG. 6F) at output terminal 5b of control circuit 5 is supplied to the control signal input terminal 1f of variable frequency oscillator 1 as a control signal, and the output voltage of low pass filter 4 is also applied through resistor 6 to the control signal input terminal 1f. Since the negative output voltage of control circuit 5 occurring at the time I (FIG. 6F) is supplied to control signal input terminal 1f in superimposed relation to the positive output voltage of low pass filter 4, the backward bias voltage of variable capacitance diode 1d increases abruptly and hence its capacity is decreased. As a result, the phase locked loop circuit attains its unlocking state. In this case, since the oscillation frequency $f_S$ of the variable frequency oscillator 1 is determined by equation (1), this oscillation frequency $f_S$ increases. If the increased oscillation frequency $f_S$ is within the capture range for the frequency $f_{S2}$, the phase locked loop circuit is brought into the locking state at the frequency $f_{S2}$, as shown in FIG. 6G.

Conversely, if the capacity or capacitance of variable capacitor 1a is increased to change the locking state at frequency $f_{S1}$ to that at frequency $f_{S3}$, the output voltage of low pass filter 4 is decreased. In this case, when the output voltage of low pass filter 4 is decreased below the threshold value of Schmitt trigger circuit 5d, as shown at J on FIG. 7A, the output voltage of Schmitt trigger circuit 5d is lowered from the ground potential to a negative potential as shown on FIG. 7B. This output voltage of Schmitt trigger circuit 5d is differentiated by capacitor 5m and the resulting differentiated voltage (FIG. 7C) is fed to the input terminal of inverse amplifier (FIG. 7C). The output voltage of inverse amplifier 5n (FIG. 7D) is differentiated by the differentiation circuit formed of capacitor 5o and resistor 5q, so that the voltage applied to the base of transistor 5p has the waveform shown on FIG. 7E. The transistor 5p is turned ON during only the time interval in which its base potential is negative. Thus, the potential at the output terminal 5b rises to the positive voltage applied to the positive power supply terminal 5s at the time K and thereafter returns to its original value, as shown in FIG. 7F.

The positive output voltage of control circuit 5 occurring at the time K is supplied to the control signal input terminal 1f of variable frequency oscillator 1 and the negative output voltage of the low pass filter 4 is also fed through resistor 6 to the control signal input terminal 1f. Since the positive output volage of the control circuit 5 is fed to input terminal 1f in superimposed relation to the negative output voltage of low pass filter 4, the backward bias voltage of variable capacitance diode 1d is decreased abruptly and its capacity is increased. As a result, the phase locked loop circuit is brought into an unlocking state. In this case, since the oscillation frequency $f_S$ of the variable frequency oscillator 1 is determined by equation (1), the oscillation frequency $f_S$ is decreased. If this decreased oscillation frequency $f_S$ is within the capture range of the frequency $f_{S3}$, the phase locked loop circuit is brought into a locking state at the frequency $f_{S3}$, as shown on FIG. 7G.

As described above, in the phase locked loop circuit according to the invention, its apparent lock range can be changed to eliminate the unlocking state without varying the total gain G by suitably selecting the threshold voltages of the Schmitt trigger circuits 5c and 5d in control circuit 5.

By way of example, it has been ascertained that, if the oscillation frequency of reference signal oscillator 3 is 100 KHz and the lock range $+f_L$ is selected to be more than 50 KHz, the unlocking state can be avoided.

Accordingly, when the phase locked loop circuit according to this invention is used in an FM radio receiver so as to produce a local oscillation frequency signal of its tuner, respective stations can be received continuously. Since the local oscillation frequency signal is not brought into an unlocking state between the respective stations, the production of undesired noise is avoided.

Another embodiment of the present invention will now be described with reference to FIGS. 8 and 9 in which the elements having the same functions as those described with reference to FIGS. 4 and 5 are identified by the same reference numerals, and the detailed description of such elements will be omitted for the sake of simplicity.

In the phase locked loop circuit shown on FIG. 8, the output signal or voltage of the low pass filter 4 is fed to the input terminal 5a of the control circuit 5, and the output voltage obtained at the output terminal 5b of control circuit 5 is fed to the control signal input terminal 1f of the variable frequency oscillator 1, as before. Moreover, the input and output terminals 5a and 5b of control circuit 5 are connected through the resistor 6. In FIG. 8, there is further provided a muting signal detector 20 for detecting a muting signal from the output signal of control circuit 5, and the detector 20 has a muting signal output terminal 5c' which is connected to a relay driving circuit (not shown). When the potential at the muting signal output terminal 5c' is a predetermined positive voltage at a time indicated at H on FIG. 10A, the primary side of a coil L, which drives a speaker SP, is short-circuited by a switch S which is controlled by a relay (not shown) to cut off the signal path of an audio signal supplied to a terminal t for a radio receiver (not shown). Thus, the audio output is short-circuited so as to prevent a noise from being reproduced by speaker SP when the local oscillation frequency signal is being changed or switched.

The control circuit 5 and the muting signal detector 20 will now be described in detail with reference to FIG. 9, in which the output voltage of low pass filter 4 is shown to be fed through input terminal 5a of control circuit 5 to both the Schmitt trigger circuits 5c and 5d, respectivey. The Schmitt trigger circuit 5c is selected so that its output voltage is normally of the ground potential but becomes a predetermined positive potential when its input voltage exceeds a predetermined threshold voltage thereof, while the other Schmitt trigger circuit 5d is selected so that its output voltage is normally of the ground potential but becomes a predetermined negative potential when its input voltage becomes lower than a predetermined threshold voltage thereof which will be described later. Therefore, when the input voltage to control circuit 5 is within a predetermined range, both Schmitt trigger circuits 5c and 5d are inoperative and, hence, control circuit 5 is inoperative. In that case, only the output voltage of low pass filter 4 is supplied through resistor 6 to control signal input terminal 1f of the variable frequency oscillator 1.

The output voltage of Schmitt trigger circuit 5c is fed through a capacitor 5e to the base of an NPN-type transistor 10a, which forms an inverse amplifier 5f. The base of transistor 10a is grounded through a resistor 11a which, with capacitor 5e, forms a differentiation circuit, and the collector of transistor 10a is connected through a resistor 12a to a positive power supply terminal 5s which is supplied with a positive DC voltage of, for example, +15V. The collector voltage of transistor 10a is fed through a capacitor 5g to the base of an NPN-type transistor 5h whose base is connected through a resistor 5i to a negative power supply terminal 5k which is supplied with a negative DC voltage of, for example, −15V. Capacitor 5g and resistor 5i form a differentiation circuit for the collector voltage of transistor 10a. The collector of transistor 5h is connected through a resistor 5l to output terminal 5b, and the emitter of transistor 5h is connected through a resistor 5j to the negative power supply terminal 5k. The cathode of a diode 13 is connected to the collector of transistor 10a, and the anode of diode 13 is connected through a resistor 18 to positive power supply terminal 5s and through a resistor 14a to the base of a PNP-type transistor 15a. This transistor 15a is connected, at its emitter, to positive power supply terminal 5s, at its collector, to the ground through a resistor 16 and also to the muting signal output terminal 15c' which is, in turn, grounded through a capacitor 19. When the potential at the muting signal output terminal 5c' is a predetermined positive voltage, the primary side of coil L for driving the speaker SP is short-circuited through switch S (FIG. 8) which is actuated by a well known relay driving circuit (not shown).

Similarly, the output voltage of the other Schmitt trigger circuit 5d is fed through a capacitor 5m to the base of a PNP-type transistor 10b which will form an inverse amplifier 5n. The base of transistor 10b is also connected through a resistor 11b, which with capacitor 5m forms a differentiation circuit, to the ground, and the collector of transistor 10b is connected through a resistor 12b to the negative power supply terminal 5k. The collector voltage of transistor 10b is fed through a capacitor 5o to the base of a PNP-type transistor 5p. The base and emitter of transistor 5p are respectively connected through a resistor 5q and a resistor 5r to the positive power supply terminal 5s. Capacitor 5o and resistor 5q form a differentiation circuit for the collector voltage of transistor 10b. The collector of transistor 5p is connected through resistor 5l to the output terminal 5b. Further, the collector of transistor 10b is connected through a resistor 14b to the base of an NPN-type transistor 15b whose base is connected through a resistor 17 to negative power supply terminal 5k and whose emitter is directly connected to terminal 5k. The collector of transistor 15b is connected through a resistor 34 to the anode of diode 13.

The operation of the embodiment of the invention shown on FIGS. 8 and 9 will now be described with reference to FIGS. 10A to 10H and FIGS. 11A to 11H. When the capacity or capacitance of variable capacitor 1a in the variable frequency oscillator 1 is decreased to change the locking state of the frequency $f_{S1}$ to that of the frequency $f_{S2}$, the output voltage of low pass filter 4 is increased. in this case, if the output voltage of low pass filter 4 exceeds the threshold voltage of Schmitt trigger circuit 5c at the time H on FIG. 10A, the output voltage of Schmitt trigger circuit 5c is changed to the predetermined positive potential from the ground potential, as shown on FIG. 10B. This positive potential is differentiated by capacitor 5e and resistor 11a, and the resulting differentiated voltage (FIG. 10C) is supplied to the base of transistor 10a. As a result, the collector voltage of transistor 10a is shown on FIG. 10D. This collector voltage is differentiated by the differentiation circuit formed of the capacitor 5g and resistor 5i and the resulting differentiated voltage (FIG. 10E) is fed to the base of transistor 5h. The transistor 5h is turned ON during only time interval in which the base potential thereof (FIG. 10E) is positive, and hence the potential at output terminal 5b (FIG. 10F) falls to the negative voltage applied to the negative power supply terminal 5k at the time I and thereafter returns to the original potential.

Figure 10:
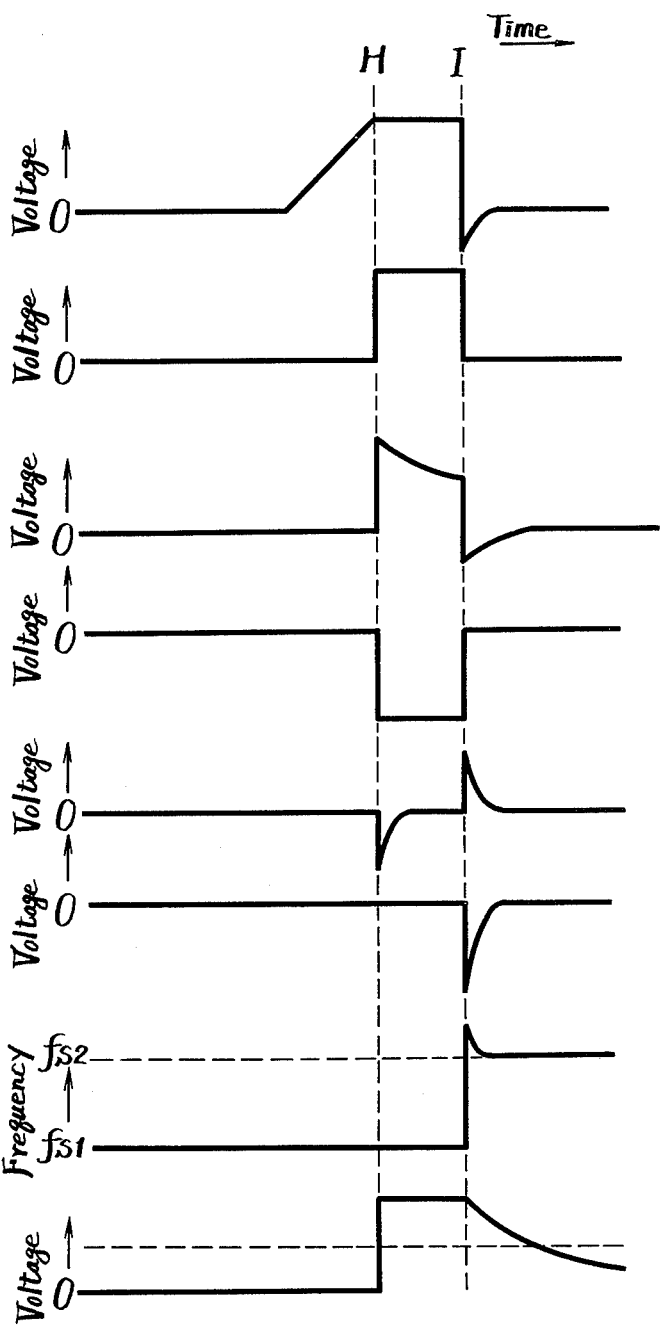

When the collector voltage of transistor 10a is reduced to ground potential at the time H, as shown on FIG. 10D, the base potential of transistor 15a is lowered due to the voltage drop across resistor 18, and hence transistor 15a is turned ON. As a result, the collector potential of transistor 15a becomes the positive potential at positive power supply terminal 5s. After transistor 15a is turned OFF at the time I, the voltage at muting signal output terminal 5c' is discharged as shown on FIG. 10H, with a time constant determined by resistor 16, capacitor 19 and the input impedance of the relay driving circuit which will be connected to the muting signal output terminal 5c'. When the potential at muting signal output terminal 5c' is equal to, or greater than a predetermined positive voltage indicated by the dotted line on FIG. 10H, the primary side of coil L for driving the speaker SP (FIG. 8) is short-circuited by switch S. For this reason, when the local oscillation frequency signal is changed or switched, the audio signal as well as any noise are short-circuited or suppressed.

As previously described, the output voltage of control circuit 5 is applied to control signal input terminal 1f of variable frequency oscillator 1, and the output voltage of low pass filter 4 is also applied, through resistor 6, to the same control signal input terminal 1f. Since the output voltage of control circuit 5 is fed to the control signal input terminal 1f in superimposed relation to the output voltage of low pass filter 4, the bias voltage across variable capacitance diode 1d in the backward direction increases abruptly and hence its capacitance is decreased. As a result, the oscillation frequency $f_S$ of variable frequency oscillator 1 is increased. If the increased oscillation frequency of variable frequency oscillator 1 is within the capture range for the frequency $f_{S2}$, the phase locked loop circuit of FIGS. 8 and 9 is brought into the locking state at the frequency $f_{S2}$, as shown on FIG. 10G. Thereafter, the short-circuit state of switch S is released.

Conversely, when the capacitance of variable capacitor 1a is increased to change the locking state from that for the frequency $f_{S1}$ to the locking state for the frequency $f_{S3}$, the output voltage of low pass filter 4 is decreased. In such case, if the output voltage is lowered more than the threshold value of Schmitt trigger circuit 5d at the time J on FIG. 11A, the output voltage of Schmitt trigger circuit 5d is changed to a negative potential from the ground potential, as shown on FIG. 11B. This output voltage of Schmitt trigger circuit 5d is differentiated by the capacitor 5m and resistor 11b and the resulting differentiated output (FIG. 11C) is fed to the base of transistor 10b. The collector voltage (FIG. 11D) of transistor 10b is differentiated by the differentiation circuit formed of capacitor 5o and resistor 5q and the resulting differential signal (FIG. 11E) is fed to the base of transistor 5p. The transistor 5p is turned ON during only the time period in which its base potential is negative. Thus, the potential at output terminal 5b (FIG. 11F) rises to the positive voltage applied to positive power supply terminal 5s at the time K, and thereafter returns to its original value. When the collector voltage of transistor 10b becomes a positive potential, as shown on FIG. 11D, the transistor 15b, whose base is connected through resistor 14b to the collector of transistor 10b, is turned ON. As a result, a current flows through resistors 18 and 34, and the base potential of transistor 15a is lowered due to the voltage drop across resistor 18. Thus, transistor 15a is turned ON and its collector voltage becomes the positive voltage at the positive power supply terminal 5s. After transistor 15a is turned OFF at the time K, the output voltage at muting signal output terminal 5c' is discharged with a time constant determined by capacitor 19 and the input impedance of the relay driving circuit connected to the muting signal output terminal 5c', as shown on FIG. 11H. When the potential at muting signal output terminal 5c' becomes equal to, or greater than the predetermined positive voltage indicated by the dotted line on FIG. 11H, the primary side of coil L for driving speaker SP is short-circuited by switch S (FIG. 8). Therefore, once again the audio output as well as any noise are short-circuited when the local oscillation frequency signal is changed or switched.

As before, the control signal input terminal 1f of variable frequency oscillator 1 is supplied with the output voltage of control circuit 5 and also with the output voltage of low pass filter 4 through resistor 6 in superimposed relation with each other, so that the bias voltage across variable capacitance diode 1d in the backward direction is decreased rapidly and hence its capacitance increases. Therefore, the oscillation frequency $f_S$ of variable frequency oscillator 1, as expressed by equation (1), is decreased. When the lowered oscillation frequency of variable frequency oscillator 1 falls within the capture range at the locking state of the frequency $f_{S3}$, the phase locked loop circuit of the present invention is brought into the locking state for the frequency $f_{S3}$, as shown on FIG. 11G. Thereafter, the short-circuiting of the audio signal by the switch S is discontinued.

As described before, in the phase locked loop circuit of FIGS. 8 and 9, the apparent lock range can be changed to remove the unlocking state without varying its total gain G by suitably selecting the threshold voltages of the Schmitt trigger circuits 5c and 5d, respectively. Further, in the embodiment of FIGS. 8 and 9, upon changing the locking frequency, the muting signal is detected. Accordingly, when the phase locked loop circuit of FIGS. 8 and 9 is used in an FM radio receiver for producing the local oscillation frequency signal of its tuner, the FM receiver can receive the respective stations continuously with no fear that the local oscillation frequency signal is brought into an unlocking state between the stations and an undesired noise is produced.

Further, since the muting signal is detected at the same time that the local oscillation frequency signal is switched or changed, no noise is produced by operating the muting circuit to achieve the muting when the local oscillation frequency signal is switched.

Although illustrative embodiments of the invention have been described in detail herein with reference to the accompanying drawings, it is to be noted that the invention is not limited to those precise embodiments, and that various changes and modifications may be effected therein by one skilled in the art without departing from the scope or spirit of the invention as defined in the appended claims.

What is claimed is:

1. In a phase locked loop circuit having a variable frequency oscillator, a reference signal oscillator, a phase comparator supplied with output signals of said variable frequency oscillator and said reference signal oscillator, respectively, and detecting a phase difference therebetween to provide a corresponding output signal and a low pass filter supplied with said output signal of the phase comparator to provide a corresponding DC voltage for controlling the variable frequency oscillator so as to phase-lock the phase of said variable frequency oscillator into the phase of said reference signal oscillator, the frequency of said variable frequency oscillator being varied manually in such a way that the frequency of said variable frequency oscillator equals an integral multiple of the frequency of said reference signal oscillator; means for detecting said DC voltage from the low pass filter, circuit means for generating a control signal when said DC voltage exceeds a predetermined value, with said control signal having a polarity different from the polarity of said DC voltage from said low pass filter and with the amplitude of said control signal being larger than that of said DC voltage, means for combining said DC voltage and said control signal to provide a combined output signal, and means for controlling the frequency and phase of said variable frequency oscillator in response to said combined output signal of said combining means in such a way that the frequency of said variable frequency oscillator is varied outside of the lock range of the phase locked loop and toward the capture range of the phase locked loop until the next succeeding phase locking state is obtained: said circuit means for generating the control signal including an input terminal connected to said low pass filter; first and second Schmitt trigger circuits each connected to said input terminal and supplied with said DC voltage therefrom so as to produce respective pulse control signals when the DC voltage exceeds said predetermined value in opposite polarities, respectively; first and second differentiating circuits connected to said first and second Schmitt trigger circuits and producing respective output signals; first and second inverting amplifiers for receiving the output signals from said first and second differentiating circuits and producing respective phase inverted output signals; third and fourth differentiating circuits connected to said first and second inverting amplifiers, respectively, and producing spike-like pulse signals at the front and back edges of the respective phase inverted output signals; and a transistor switching circuit supplied with said spike-like pulse signals from said third and fourth differentiating circuits so as to generate said control signal.

2. A phase locked loop circuit according to claim 1; in which said transistor switching circuit includes
   a positive DC voltage source and a negative DC voltage source;
   first and second transistors, each having base, emitter and collector electrodes;
   circuit means for connecting the emitter electrodes of said first and second transistors to said positive and negative DC voltage sources through first and second resistors, respectively;
   circuit means for connecting the base electrodes of said first and second transistors to the outputs of said fourth and third differentiating circuits, respectively; and
   circuit means for connecting the collector electrodes of said first and second transistors to each other and to an output terminal from which said control signal is derived.

3. A phase locked loop circuit according to claim 2; in which said means for combining the control signal at the output terminal of said transistor switching circuit and the DC voltage from said low pass filter includes a resistor connected between said input and output terminals of the circuit means for generating the control signal.

4. In a phase locked loop circuit having a variable frequency oscillator, a reference signal oscillator, a phase comparator supplied with output signals of said variable frequency oscillator and said reference signal oscillator, respectively, and detecting a phase difference therebetween to provide a corresponding output signal and a low pass filter supplied with said output signal of the phase comparator to provide a corresponding DC voltage for controlling the variable frequency oscillator so as to phase-lock the phase of said variable frequency oscillator into the phase of said reference signal oscillator, and in which the frequency of said variable frequency oscillator is varied manually in such a way that the frequency of said variable frequency oscillator equals an integral multiple of the frequency of said reference signal oscillator; said phase locked loop circuit further comprising means for detecting said DC voltage from the low pass filter, circuit means for generating a control signal when said DC voltage exceeds a predetermined value, means for combining said DC voltage and said control signal to provide a combined output signal, means for controlling the frequency and phase of said variable frequency oscillator in response to said combined output signal of said combining means in such a way that the frequency of said variable frequency oscillator is varied outside of the lock range of the phase locked loop and toward the capture range of the phase locked loop until the next succeeding phase locking state is obtained, a signal transmitting path, muting circuit means provided in said transmitting path and for interrupting the signal transmission therein, and muting control signal detecting means adapted to control the interruption of signal transmission by said muting circuit means; and in which said muting control signal detecting means is connected to said circuit means for generating the control signal.

5. A phase locked loop circuit according to claim 4; in which said circuit means for generating the control signal includes first and second Scmitt trigger circuit connected to said low pass filter and producing respective control pulse signals when the DC voltage from said low pass filter is outside a predetermined voltage range, and said muting control signal detecting means is responsive to said control pulse signals from said Schmitt trigger circuits.

6. A phase locked loop circuit according to claim 5; in which said circuit means for generating the control signal further includes first and second differentiating circuit for differentiating said control pulse signals from said first and second Schmitt trigger circuits, and first and second inverting amplifiers for inverting the outputs of said first and second differentiating circuits, respectively; and in which said muting control signal detecting means is connected to the outputs of said inverting amplifiers.

7. A phase locked loop circuit according to claim 6; in which said muting control signal detecting means includes first and second transistors which are controlled by output pulse signals from said first and second inverting amplifiers so as to produce a muting control signal which has a predetermined time period longer than the pulse duration of one of the output pulse signals from said inverting amplifiers.

* * * * *